United States Patent [19]

Steinmann

[11] Patent Number: 4,734,481

[45] Date of Patent: Mar. 29, 1988

[54] NOVEL ORGANOMETALLIC POLYMERS

[75] Inventor: Alfred Steinmann, Villars-sur-Glâne, Switzerland

[73] Assignee: Ciba-Geigy Corporation, Ardsley, N.Y.

[21] Appl. No.: 1,312

[22] Filed: Jan. 8, 1987

[30] Foreign Application Priority Data

Jan. 16, 1986 [CH] Switzerland ............... 147/86

[51] Int. Cl.$^4$ .............................. C08G 77/00
[52] U.S. Cl. ........................ 528/43; 522/148; 522/166; 528/13; 528/25; 528/230; 528/245; 528/270
[58] Field of Search .......... 528/25, 230, 245, 270, 528/13, 43; 522/148, 166

[56] References Cited

U.S. PATENT DOCUMENTS

| | | | |
|---|---|---|---|
| 3,609,123 | 9/1971 | Rabilloud et al. | 528/208 |
| 3,867,142 | 2/1975 | Krause | 430/270 |
| 4,075,175 | 2/1978 | Foss | 528/238 |
| 4,108,839 | 8/1978 | Chambers et al. | 528/270 |
| 4,504,646 | 3/1985 | Nate et al. | 528/16 |

*Primary Examiner*—Lucille M. Phynes
*Attorney, Agent, or Firm*—Edward McC. Roberts

[57] ABSTRACT

Homopolymers or copolymers of organometallic, end-capped polyphthalaldehydes containing the repeating unit of formula I

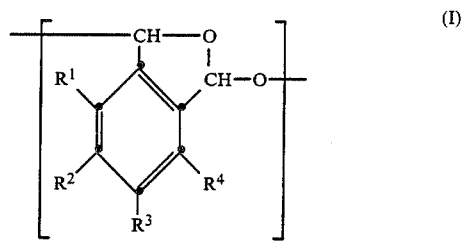

wherein $R^1$, $R^2$, $R^3$ and $R^4$ are each independently of the other hydrogen, halogen, cyano, nitro, carboxyl, hydroxyl, $C_1$-$C_4$alkoxy, $C_1$-$C_4$alkylthio or $C_1$-$C_4$alkoxycarbonyl, and at least one of the substituents $R^1$, $R^2$, $R^3$ and $R^4$ are a group —$Q(R^5)_3$ or —$Q(R^6)_3$, where Q is Si, Sn, Ge, $CH_2$—Si or O—Si, $R^5$ is $C_1$-$C_{12}$alkyl and $R^6$ is $C_6$-$C_{10}$aryl, are suitable for producing dry-developed, plasma-resistant photoresists required for the production of structured images, especially for microelectronics.

11 Claims, No Drawings

NOVEL ORGANOMETALLIC POLYMERS

The present invention relates to novel organometallic polyphthalal-dehydes, to photosensitive, dry-developing compositions which are resistant to oxygen plasma and which contain these compounds, and to the use thereof for producing structured positive images.

By dry-developing or self-developing compositions (resists) are meant a class of compounds which, when irradiated, decompose into volatile particles or which, upon irradiation with a plasma, can be structured without the need of wet development for image formation. Different materials have been proposed for this utility, e.g. polymethylmethacrylate, polyethyleneterephthalate, nitrocellulose or polyisoprene (q.v. for example H. Franke, Appl. Phys. Lett. 45 (1), 110 ff. (1984). The use of such materials frequently results in the occurrence of different shortcomings such as low sensitivity, inadequate stability, formation of non-volatile residues, lack of resistance to oxygen plasma, or poor resolution.

EP-A No. 126 214 describes a system that is distinguished by good sensitivity. The self-developing composition consists of polyphthalaldehyde which is depolymerised catalytically by photochemically produced acids and the resultant phthalaldehyde monomers are evaporated.

The disadvantage of this system resides in the substantial amount of initiator of 10 % by weight which is required to achieve a sensitivity of 1.5–5 mJ/cm$^2$. High concentrations of acid catalyst are therefore undesirable, because residues remain even after thermal self-development in the system and thus constitute an appreciable danger of contamination. If the concentration of initiator is reduced in the system of EP-A No. 126 214, then the required exposure energies increase by a multiple. Moreover, this system is unstable under the plasma etching conditions (e.g. O$_2$ plasma) normally applied for transferring structures to an underlying organic planarising resin.

Another self-developing polyaldehyde system is disclosed in EP-A No. 109 617. As aliphatic polyaldehydes are virtually insoluble in organic solvents and, in addition, have a low glass transition temperature T$_g$, they are not suitable materials for imprinting an image. For this reason, silicon-containing substituents are introduced to enhance the solubility. However, the solubility properties are still unsatisfactory, the T$_g$ even lower, and high-energy radiation is required for imaging.

There has now been found a class of organometallic, end-capped polyphthalaldehydes which are distinguished by surprisingly high sensitivity. The required amounts of initiator and the irradiation energies are exceedingly small compared with conventional systems. In connection therewith, the amount of non-volatile residues is minimal. The compositions have very good solubility and film forming properties as well as good temperature stability and oxygen plasma resistance.

Accordingly, the invention relates to organometallic, end-capped polyphthalaldehydes containing the repeating unit of formula I

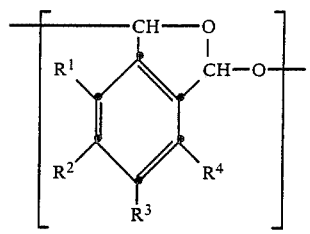

wherein R$^1$, R$^2$, R$^3$ and R$^4$ are each independently of the other hydrogen, halogen, cyano, nitro, carboxyl, hydroxyl, C$_1$–C$_4$ alkoxy, C$_1$–C$_4$ alkylthio or C$_1$–C$_4$ alkoxycarbonyl, and at least one of the substituents R$^1$, R$^2$, R$^3$ and R$^4$ is a group —Q(R$^5$)$_3$ or —Q(R$^6$)$_3$, where Q is Si, Sn. Ge, CH$_2$-Si or 0-Si, R$^5$ is C$_1$–C$_{12}$ alkyl and R$^6$ is C$_6$–C$_{10}$ aryl.

C$_1$–C$_4$Alkoxy is e.g. methoxy, ethoxy, n-propoxy or n-butoxy, preferably methoxy R$^1$ to R$^4$ as alkylthio are methylthio, ethylthio, n-propylthio or n-butylthio, with methylthio being preferred.

Alkoxycarbonyl is e.g. methoxycarbonyl, ethoxycarbonyl, n-propoxycarbonyl or n-butoxycarbonyl.

At least one, preferably one or two and, most preferably, two of the substituents R$^1$ to R$^4$ are a group —Q(R$^5$)$_3$ or —Q(R$^6$)$_3$—, with silicon-containing radicals being preferred.

R$^5$ is C$_1$–C$_{12}$alkyl, preferably C$_1$–C$_4$alkyl, and is most preferably methyl or ethyl. R$^5$ may also be isopropyl, n-propyl, n-butyl, n-hexyl, n-octyl, n-decyl or n-dodecyl.

R$^6$ as C$_6$–C$_{10}$ aryl is preferably phenyl or naphthyl.

In preferred compounds, all radicals R$^5$ and R$^6$ bound to metal are identical.

Particularly preferred compounds are those wherein R$^2$ and R$^3$ are a group —Q(R$^5$)$_3$ or —Si(R$^6$)$_3$ and the other substituents R$^1$ and R$^4$ are hydrogen.

The polymers of formula I are stabilised by end-capping them in known manner. Suitable terminating groups are the amines or acyls which have been described e.g. by Hiroshi Ito and C. G. Willson, Polym. Eng. Sci. 23, 1012 ff. (1983) [q.v. also Macromolecules 2(4), 414 (1969)].

The polymers containing the repeating unit of formula I preferably have an average molecular weight of 10,000 to 1,000,000 and, most preferably, from 50,000 to 400,000.

The novel polymers of the present invention are preferably homopolymers. However, suitable for use as photosensitive, dry-developing compositions are also copolymers, for example copolymers which are composed of two or more units of formula I of different structure, or copolymers which, in addition to containing structural units of formula I, contain other units derived from copolymerisable monomers. Accordingly, the present invention also relates to copolymers of organometallic phthalaldehydes containing the repeating structural unit of formula I

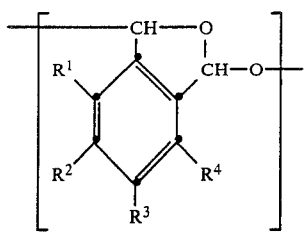
(I)

wherein the substituents $R^1$ to $R^4$ are as defined above, and up to 50 mole %, based on the entire copolymer, of at least one structural unit of formula II, III or IV

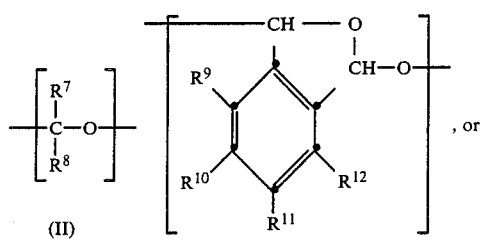
(II)  (III)

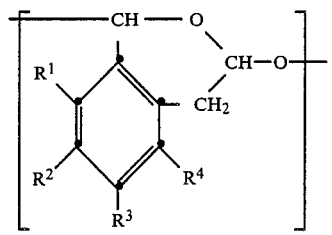
(IV)

wherein $R^1$, $R^2$, $R^3$ and $R^4$ are as defined above and $R^7$ and $R^8$ are each independently of the other hydrogen, $C_1$–$C_4$alkyl, phenyl, or $C_1$–$C_4$ alkyl or phenyl, each substituted by a group —$Q(R^5)_3$ or —$Si(R^6)_3$, and Q, $R^5$ and $R^6$ are as defined above and $R^9$, $R^{10}$, $R^{11}$ and $R^{12}$ are each independently of the other hydrogen, halogen, cyano, nitro, carboxyl, hydroxyl, $C_1$–$C_4$alkyl, $C_1$–$C_4$alkoxy, $C_1$–$C_4$alkylthio or $C_1$–$C_4$ alkoxycarbonyl.

$R^7$ and $R^8$ as $C_1$–$C_4$alkyl are e.g. methyl, ethyl, isopropyl, n-propyl or n-butyl, with methyl being preferred. These alkyl groups, if substituted, preferably carry a —$Q(R^5)_3$ or —$Si(R^6)_3$ group, where Q, $R^5$ and $R^6$ have the meanings assigned to them above.

$R^7$ and $R^8$ as substituted phenyl is phenyl which is disubstituted, preferably monosubstituted by a —$Q(R^5)_3$ or —$Si(R^6)_3$ group, where Q, $R^5$ and $R^6$ have the meanings assigned to them above.

Within the scope of the indicated definitions, the substituents $R^9$, $R^{10}$, $R^{11}$ and $R^{12}$ have the meanings assigned to them under formula I.

Typical representatives of monomers from which the structural units of formulae II, III or IV are derived are: $OCH—CH_2CH_2—Si(CH_3)_3$, $OCH—C_6H_4—(p-)Si(CH_3)_3$, phthalaldehyde, or o-formylphenylacetaldehyde.

Monomers from which structural units of formula III are derived are particularly suitable.

The preparation of the homo- and copolymers of this invention is effected in a manner known per se by polymerising a phthalaldehyde of formula V

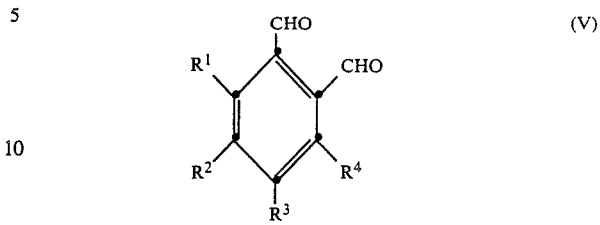
(V)

at low temperature and in the presence of different catalysts. Such a polymerisation is normally carried out in a solvent such as methylene chloride, toluene or tetrahydrofuran. Suitable catalysts are cationic catalysts such as boron trifluoride etherate, triphenylmethyltetrafluoroborate, tin tetrachloride and the like; and also anionic catalysts such as lithium tert-butyrate, sodium naphthalide, butyllithium or phenylmagnesium bromide and the like; as well as co-ordination catalysts such as triethylaluminium/titanium tetrachloride, triethylaluminium/vanadium tetrachloride, triethylaluminium/trichlorovanadate or triethylaluminium/cobalt dichloride.

The polymerisation can also be initiated by X-ray irradiation.

The reaction time is from about 1 to 10 hours and the resultant polymer can be end-capped in known manner. Examples of suitable terminating agents are amines for the cationic reaction or acid chlorides for the anionic reaction.

The preparation of the polymers of this invention is effected e.g. by the methods described in U.S. Pat. No. 3 940 507 or in accordance with C. Aso and S. Tagami, Macromolecules 2, 414 ff. (1969).

The copolymers of this invention can in principle be prepared by the same method by copolymerising a phthalaldehyde of formula V with at least one monomer of formulae II*, III* or IV*

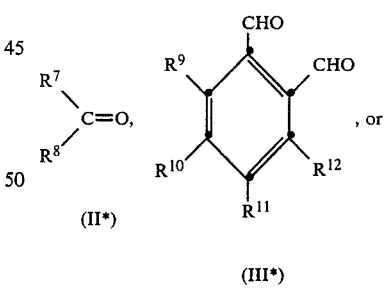
(II*)  (III*)

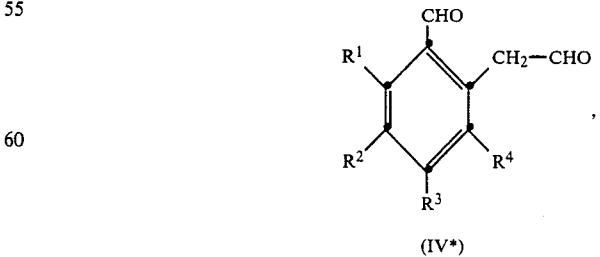
(IV*)

wherein the substituents are as defined above, in a manner known per se in the ratios indicated above for the homopolymerisation.

The monomers of formulae II*, III* and IV* are known compounds and, if some are still novel, can be prepared by methods analogous to known ones.

The monomers of formulae V are novel and can be prepared in a manner known per se from the corresponding halides of formulae VI or VII

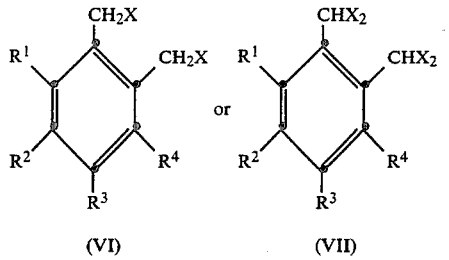

wherein $R^1$, $R^2$, $R^3$ and $R^4$ are as defined for formula I and X is Br, Cl or I.

The conversion of the compounds of formula VI into the phthalaldehydes of formula V is effected by oxidation with e.g. dimethylsulfoxide or hexamethylenetriamine. Such methods are described e.g. in J. Chem. Soc. 692 (1940); J. Org. Chem. 24, 1792 ff. (1059) or J. Am. Chem. Soc. 81, 4113 ff. (1959).

Regarding the preparation of the phthalaldehydes of formula V from the corresponding tetrahalo compounds of formula VII by hydrolysis with a metal salt or ammonium salt of an organic acid in aqueous medium and in the presence of a phase transfer catalyst and an inorganic base, attention is drawn e.g. to the method described in EP-A. No. 03 230. The oxidation with potassium oxalate is described in "Organic Synthesis", Coll. Vol. IV, 807 ff. (1963). The compounds of formulae VI and VII can be prepared by methods analogous to those described in J. Chem. Soc. 79, page 6450 ff. (1957), by brominating compounds of formula VIII

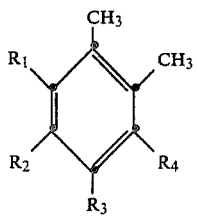

wherein $R_1$, $R_2$, $R_3$ and $R_4$ are as defined for formula I, with N-bromosuccinimide in the presence of a catalyst, preferably a peroxide such as benzoyl peroxide, to give compounds of formula VI or VII.

The compounds of formula VIII are known and can be prepared e.g. as described in J. Chem. Soc. 3640 (1959) and J. Organomet. Chem. 84(2) (1975), 165-175, J. Organomet. Chem. 289 (2.3) (1985), 331-9, or in analogous manner.

The polymers of this invention are admirably suited for use as a photosensitive, dry-developing recording material. As already mentioned, compounds containing the repeating unit of formula I can be used for the preparation of positive photoresist systems.

Hence the invention also relates to photosensitive, dry-developing compositions containing an organometallic, end-capped polyphthalaldehyde which contains the repeating unit of formula I, as well as to copolymers which are obtained by copolymerisation of phthalaldehydes of formula V with up to 50 mole % of monomers of formula II, III or IV and a compound that splits off acid when exposed to actinic radiation.

Photosensitive compounds that form or split off acid on exposure to light are known in large number. They include e.g. the diazonium salts used in producing diazotypes, the o-quinone diazides used in known positive copying compositions, or halogen compounds that form hydrohalic acids on exposure to radiation. Compounds of this type are disclosed e.g. in U.S. Pat. Nos. 3,515,552, 3,536,489 and 3,779,778, and in German Offenlegungsschrift specifications Nos. 2 718 259, 2 243 621 and 2 610 842.

Suitable photosensitive components of the compositions of this invention are also cationic photoinitiators selected from the group of the iodonium or sulfonium salts. Such compounds are described e.g. in "UV-Curing, Science and Technology" (Editor: S. P. Pappas, Technology Marketing Corp., 642 Westover Road, Stanford, Conn., USA). In particular, diaryliodosyl salts may also be used. Such compounds are disclosed e.g. in European patent application EP-A No. 106 797.

It is also possible to use sulfoxonium salts as photosensitive compounds. Such salts are disclosed e.g. in European patent specification No. 35,969 or in European patent application EP-A No. 44,274 and No. 54 509. Particularly suitable sulfoxonium salts are those that absorb in the low ultraviolet range.

Particularly useful compounds are also those that form sulfonic acids on exposure to actinic light. Such compounds are known per se and are disclosed e.g. in UK patent application No. 2 120 263, European patent applications EP-A Nos. 84,515, 37 152 and 58 638, and in U.S. Pat. Nos. 4 258 121 and 4 371 605.

Salts when employed as photosensitive acid donors are preferably soluble in organic solvents. Most preferably, these salts are separation products with complex acids, for example of hydrofluoroboric acid or hexafluorophosphoric acid.

Depending on the nature and composition of the photosensitive mixture, the amount of photosensitive component (b) in the compositions of this invention can vary within wide limits. Good results are obtained with amounts of about 0.05 to 5% by weight of component, based on the polyphthalaldehyde. It is preferred to use 0.2 to 1% by weight of acid donor, based on the polyphthalaldehyde. As the photosensitive component (initiator) remains in the system after dry development, as little of this substance as possible will preferably be used so as to prevent deleterious effects in subsequent process steps. Given the high sensitivity of the instant system, this is possible and must hence be regarded as a substantial advantage over the prior art and one that was not to be expected.

The composition of this invention may contain further conventional modifiers such as stabilisers, sensitisers, conventional polymers such as polystyrene or polymethacrylate, pigments, dyes, fillers, adhesion promoters, levelling agents, wetting agents and plasticisers. For application, the compositions may also be dissolved in suitable solvents.

The compositions of this invention are pre-eminently suitable for use as coating agents for all kinds of substrates, e.g. wood, textiles, paper, ceramics, glass, plastics such as polyesters, polyethylene terephthalate, polyolefins or cellulose acetate, preferably in the form of films, as well as metals such as Al, Cu, Ni, Fe, Zn, Mg or Co, and semi-conductor materials such as Si, $Si_3N_4$, SiO$_2$, GaAs, Ge and the like, on which it is desired to produce an image by image-wise exposure. The coated substrates constitute a further object of the invention.

The coated substrates can be prepared e.g. by treatment with a solution or suspension of the composition. Suitable solvents are all solvents of not too high polarity and of not too low boiling point, e.g. ethers, ketones or aromatic compounds such as tetrahydrofuran, dioxane, cyclohexanone, benzene or toluene. It is preferred to use 1-20% polymer solutions. The solution is applied uniformly to a substrate by known coating methods, e.g. by centrifuging, immersing, knife coating, curtain coating, brushing, spraying and reverse roller coating. It is also possible to apply the photosensitive layer to a temporary flexible support and then to coat the final substrate, e.g. a silicon wafer, by coat transfer by means of lamination.

The add-on (layer thickness) of photosensitive composition and nature of the substrate (layer support) depend on the desired field of application. A particular advantage of the compositions of this invention is that they can be used in very thin layers and that they have excellent resolution. By appropriate choice of the source of radiation and photosensitive component they are suitable for a wide range of utilities in which it is desired to produce structured images. However, they are especially useful in submicron lithography and in multilayer lithography, in which the demands made of a resist system in microelectronics are particularly exacting. For this reason, film layer thicknesses of 0.3 to 2.0 μm are preferred.

After the substrate has been coated, the solvent is normally removed by drying to give an amorphous layer of photoresist on the support.

If desired, a second layer can be applied between support and resist. This so-called planarising resin makes it possible to apply particularly thin resist layers. In principle, all organic polymers and oligomers are suitable that can be applied as a polymer solution to a support. Examples thereof are polyimides, polyamide acids, polymethylmethacrylate, novolaks or also other resist systems.

The photosensitive layer is imaged in conventional manner by suitable radiation. The irradiated areas of this layer decompose and the resultant monomers evaporate, thereby exposing the underneath layer or support. It is an advantage of the system of this invention that no solvent need be used to expose the support and that the clean and residue-free self-development yields very sharp positive images. Depending on the nature of the resultant monomer, the exposure of the support can be greatly accelerated by heating and/or applying a vacuum.

Heating is preferably effected in the temperature range from 20° to 120° C. for 1 to 60 minutes.

Exposure to actinic irradiation is effected through a quartz mask which contains a predetermined pattern or by a laser beam which is moved e.g. by logic control over the surface of the coated substrate.

Exposure is preferably made with UV irradiation (200-450 nm), electron beams, X-ray irradiation or ion beam irradiation.

What additionally distinguishes the system of this invention from the prior art is its unexpectedly high sensitivity at the same layer thickness. Although appreciably smaller amounts of photosensitive initiator are necessary, the required irradiation energy is much lower. Thus the desired result is achieved at e.g. an energy of 0.1 to 0.3 mJ/cm$^2$.

The recording material of this invention is in addition suitable for use as plasma etch resist. Thus the unexposed areas of the structured image are resistant e.g. to oxygen plasma etching conditions.

EXAMPLE 1

Preparation of 4-trimethylsilyl-α, α, α', α'-tetrabromo-o-xylene

A 1.5 liter sulfonating flask equipped with cooler and stirrer is charged, under nitrogen, with 100 g (562 millimoles) of 4-trimethyl-silyl-o-xylene, 400 g (2250 millimoles) of N-bromosuccinimide, 1 g of dibenzoyl peroxide and 750 ml of carbon tetrachloride. The reaction mixture is heated to boiling temperature until the reaction is exothermic. The heating bath is then removed until the spontaneous boiling subsides. Gas chromatographic analysis confirms that no more 4-trimethylsilyl-o-xylene is present. The mixture is cooled to 0° C. and the succinimide is separated. The filtrate is then extracted twice with 200 ml of cold 5% sodium hydroxide solution and washed once with water. The CCl$_\alpha$ phase is dried over magnesium sulfate and the CCl$_4$ is expelled in a rotary evaporator.

Yield: 250 g of a solid (90% of theory) which melts at 94° C. Two recrystallisations from a small amount of n-hexane affords white crystals with a melting point of 97° C. (boiling point of the compound: 138° C./0.13 mbar).

| Elemental analysis: | theory | found |
|---|---|---|
| C [%] | 26.75 | 26.75 |
| H [%] | 2.86 | 2.87 |
| Br [%] | 64.71 | 64.54 |
| $^1$H—NMR spectrum (acetone-d$_6$): | | |

CH$_3$—Si 9 H (s): 0.4 ppm
Br$_2$CH 2 H (s): 7.95 ppm and 7.5 ppm
H—aromat. 3 H (m): 7.6-7.85 ppm

EXAMPLE 2

Preparation of 4,5-bis(trimethylsilyl)-α, α, α', α'-tetra-bromo-o-xylene

A 1.5 liter sulfonating flask equipped with cooler and stirrer is charged, under nitrogen, with 70 g (280 millimoles) of 4,5-bis(tri-methylsilyl)-o-xylene, 224 g (1260 millimoles) of N-bromosuccinimide, 5 g of dibenzoyl peroxide and 800 ml of carbon tetrachloride.

The suspension is heated until the reaction is exothermic. When the exothermic reaction has subsided, the suspension is refluxed for about 3 hours and then cooled. Succinimide is removed by filtration and the filtrate is washed twice with 10% cold sodium hydroxide solution. The dried organic phase is freed from solvent and the residual solid is recrystallised from n-hexane, affording 120 g (75% of theory) of a solid which melts at 157° C.

| Elemental analysis: | theory | found |
|---|---|---|
| C [%] | 29.70 | 28.90 |
| H [%] | 3.92 | 4.02 |
| Br [%] | 56.46 | 56.38 |
| $^1$H—NMR spectrum (acetone-d$_6$): | | |

CH$_3$—Si 18 H (s): 0.44 ppm

-continued

| Br₂CH 2 H (s): 7.65 ppm |
| H—aromat. 2 H (s): 8.1 ppm |

EXAMPLE 3

Preparation of 4-trimethylsilyl-o-phthaldialdehyde A 750 ml sulfonating flask equipped with stirrer is charged with 175 g (355 millimoles) of 4-trimethyl-α, α, α', α'-tetrabromo-o-xylene, 119 g of sodium formate, 72 g of calcium carbonate, 26 g of tetrabutylammonium bromide and 150 ml of water. The mixture is heated to 100° C., under nitrogen, whereupon the 4-trimethyl-α, α, α', α'-tetra- bromo-o-xylene melts.

The mixture is stirred vigorously so that the different phases are well mixed. After about 12 hours, the mixture is cooled to 0° C. and the mixture is extracted with 400 ml of diethyl ether. The dried organic phase is concentrated by evaporation. The residue is subsequently chromatographed through a column of silica gel with toluene as eluant. The toluene fractions are concentrated, affording 54 g (61% of theory) of pure 4-trimethylsilyl-o-phthaldialdehyde.

This product is dissolved in approximately the same volume of n-hexane. Yellow crystals form in the cooling cabinet. Melting point: 38° C. Boiling point of the compound: 98° C./0.13 bar.

| Elemental analysis: | theory | found |
|---|---|---|
| C [%] | 64.04 | 63.94 |
| H [%] | 6.84 | 6.96 |
| Si [%] | 13.62 | 13.04 |

¹H—NMR spectrum (acetone-d₆):

| CH₃—Si 9 H (s): 0.36 ppm |
| H—aromat. 2 H (m): 8.0 ppm |
| H—aromat. 1 H (s): 8.1 ppm |
| CHO 2 H (s): 10.6 ppm |

EXAMPLE 4

Preparation of 4,5-bis(trimethylsilyl)-o-phthaldialdehyde A 750 ml sulfonating flask is charged with 85 g (150 millimoles) of 4,5-bis(trimethyl)-α, α, α', α'-tetrabromo-o-xylene, 71.5 g of sodium formate, 35 g of calcium carbonate, 113 g of tetrabutylammonium bromide, 175 ml of water and 200 ml of toluene, and the mixture is efficiently stirred at 120° C. under nitrogen. After 2 days, the reaction mixture is cooled to room temperature and diluted with toluene. The organic phase is washed with water and dried. The solvent is removed in a rotary evaporator and the solid is recrystallised from n-hexane to constant melting point. Yield: 17 g (40%) of a yellowish crystalline substance which melts at 103° C.

| Elemental analysis: | theory | found |
|---|---|---|
| C [%] | 60.38 | 59.00 |
| H [%] | 7.96 | 8.05 |

¹H—NMR spectrum (acetone-d₆):

| CH₃—Si 18 H (s): 0.4 ppm |
| H—aromat. 2 H (s): 8.3 ppm |
| CHO 2 H (s): 10.5 ppm |

EXAMPLE 5

Polymerisation of 4-trimethylsilyl-o-phthaldialdehyde A reactor is charged, under nitrogen, with 24 g (116 millimoles) of 4-trimethylsilyl-o-phthaldialdehyde and 100 ml of dry methylene chloride. The mixture is cooled in liquid nitrogen and 2 mol % of BF₃.diethyl etherate are added as initiator. The solution is then freed from oxygen under a high vacuum.

Polymerisation is carried out in a cooling bath, under nitrogen, at −78° C. After a few hours, 2 ml of a cold 1:1 mixture of −78° C. of pyridine/acetic anhydride are added to the highly viscous solution. The mixture is stirred for ½ hour at −78° C. and warmed to room temperature. The solution is poured into 1000 ml of methanol, whereupon the polymer precipitates at once. The precipitate is isolated by filtration and dried. Yield: 23.5 g. For purification, the polymer is dissolved in 300 ml of methylene chloride, the solution is filtered, and the polymer is again precipitated in 1000 ml of methanol. The precipitate is isolated by filtration and dried at room temperature under a high vacuum. Yield: 19.3 g (80% of theory).

The polymer decomposes at 156° C. Gel permeation chromatography in tetrahydrofuran gives the following values:
$\overline{M}_w = 290,000$ and $\overline{M}_n = 80,000$.

EXAMPLE 6

Polymerisation of 4,5-bis(trimethylsilyl)-o-phthaldialdehyde 4 g (14.4 millimoles) of 4,5-bis(trimethylsilyl)-o-phthaldialdeyde are dissolved in an ampoule in 12 ml of dry methylene chloride. Oxygen is removed by freezing/thawing under a high vacuum. Then 2 mol %, based on the monomer, of BF₃.diethyl etherate solution in methylene chloride is added with a syringe to the frozen solution and polymerisation is then carried out at −78° C. under nitrogen. After a few hours, 1 ml of pyridine is added to the highly viscous solution, which has been cooled beforehand. The solution is then allowed to warm to room temperature and the polymer is precipitated from methanol. The white powder is dried, dissolved in methanol, and precipitated once more in methanol. The white polymer powder is dried under a high vacuum at 50° C., affording 3.1 g (77%) of polymer.

The polymer decomposes at 170° C. Gel permeation chromatography in tetrahydrofuran gives the following values:
$\overline{M}_w = 420,000$ and $\overline{M}n = 180,000$.

¹H—NMR spectrum (CDCl₃):

| CH₃—Si | 18 H (s): | 0.4 ppm |
| H—aromat. | 2 H (s): | 8.2 ppm |
| O\\<br>   HC—aromat.<br>  /<br>O | 2 H (s): | 10.6 ppm |

EXAMPLE 7

1% by weight of diphenyliodonium hexafluoroarsenate, based on the polymer, are added to a 10% solution of the polymer of Example 3 in cyclohexanone. The filtered solution is applied to a silicon wafer at 2500 rpm by centrifuging. The polymer film is dried for 25 minutes at 95° C. The amorphous film has a thickness of 0.9 μm.

This resist film is irradiated at 254 nm for 0.2 sec through a quartz mask (intensity of the Hg-Xe lamp at 254 nm: 1 mw/cm$^2$). The exposed material is then heated for 4 min. to 110° C., whereupon structures of remarkably good resolution form in the submicron range.

EXAMPLE 8

A 0.6 μm layer of a soluble polyimide (Probimide ® 285, Ciba-Geigy AG) is applied to a silicon wafer. This layer is heat crosslinked at 300° C. Then the resist solution is applied as described in Example 7. After it has been dried, the resist layer has a thickness of 0.7 μm.

Exposure is effected as described in Example 7 and dry development is carried out for 3 minutes at 110° C. Then the exposed areas of the polyimide are completely etched away in oxygen plasma (40W, 10 sccm O$_2$, 5·10$^{-3}$ mbar) over 15 minutes, whereas the non-exposed areas of the photoresist material are not attacked. In this manner it is possible to transfer a dry-developed submicron structure in the resist anisotropically to the underneath layer of planarising resin.

EXAMPLE 9

A 2.2 μm polyimide layer (Probimide ® 285, Ciba-Geigy AG) is applied to a silicon wafer. The polyimide is made insoluble by heat crosslinking at 300° C.

To a 10% solution of the polymer of Example 8 in cyclohexanone is added 1.5% by weight of diphenyliodonium hexafluoroarsenate (based on the polymer). The solution is purified through a filter with a 0.5 μm pore diameter and applied to the insoluble polyimide. A 0.4 μm homogeneous resist film is produced by centrifuging at 4500 rpm and dried at 90° C. for 20 minutes. The dry resist film is exposed at an energy of 1 mJ/cm$^2$ at 254 nm through a quartz mask by the so-called contact printing method. The irradiated resist film is then dry developed for 20 minutes at 90° C.

The resist structures are subsequently transferred to the underneath polyimide by means of anisotropic oxygen plasma etching for 23 minutes at 25 W, 4·10$^{-2}$ mbar, 20 sccm. The polyimide is then etched away at the resist-free areas to expose the silicon wafer, whereas the polyimide covered by the resist remains completely intact.

By means of this method it is possible to produce structures 0.5 μm in width and 2.5 μm deep. Measurable residues are no longer present on the exposed silicon material.

What is claimed is:

1. An organometallic, end-capped polyphthalaldehyde containing the repeating unit of formula I

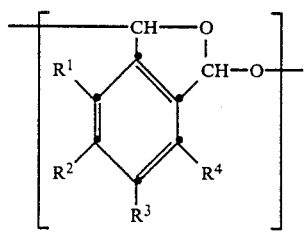

wherein R$^1$, R$^2$, R$^3$ and R$^4$ are each independently of the other hydrogen, halogen, cyano, nitro, carboxyl, hydroxyl, C$_1$-C$_4$alkoxy, C$_1$-C$_4$alkylthio or C$_1$-C$_4$alkoxycarbonyl, and at least one of the substituents R$^1$, R$^2$, R$^3$ and R$^4$ are a group —Q(R$^5$)$_3$ or —Q(R$^6$)$_3$, where Q is Si, Sn, Ge, CH$_2$—Si or O—Si, R$^5$ is C$_1$-C$_{12}$alkyl and R$^6$ is C$_6$-C$_{10}$aryl.

2. A polyphthalaldehyde according to claim 1 of formula I, wherein one or two of the substituents R$^1$, R$^2$, R$^3$ and R$^4$ are a group —Q(R$^5$)$_3$ or —Q(R$^6$)$_3$—.

3. A polyphthalaldehyde according to claim 2, wherein Q is Si, CH$_2$—Si or O—Si.

4. A polyphthalaldehyde according to claim 1 of formula I, wherein at least one of R$^2$ and R$^3$ are a group —Q(R$^5$)$_3$ or —Si(R$^6$)$_3$ and the other substituents are hydrogen.

5. A copolymer of an organometallic phthalaldehyde which, in addition to containing structural units of formula I according to claim 1, contains up to 50 mole %, based on the entire copolymer, of structural units which are derived from copolymerisable monomers.

6. A copolymer of an organometallic phthalaldehyde containing the repeating structural unit of formula I

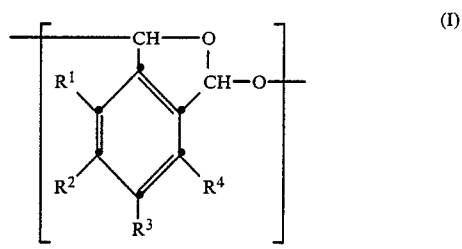

wherein the substituents R$^1$ to R$^4$ are as defined in claim 1, and up to 50 mole %, based on the entire copolymer, of at least one structural unit II, III or IV

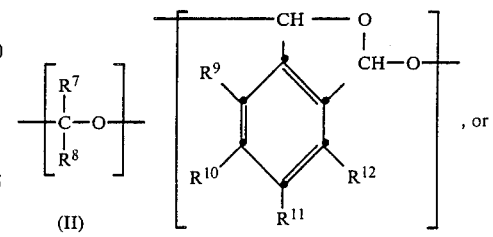

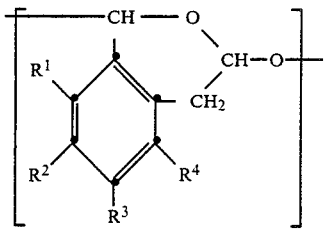

wherein R$^1$, R$^2$, R$^3$ and R$^4$ are as defined in claim 1 and R$^7$ and R$^8$ are each independently of the other hydrogen, C$_1$-C$_4$alkyl, phenyl, or C$_1$-C$_4$alkyl or phenyl, each substituted by a group —Q(R$^5$)$_3$ or —Si(R$^6$)$_3$, and Q, R$^6$ and R$^6$ are as defined in claim 1 and R$^9$, R$^{10}$, R$^{11}$ and R$^{12}$ are each independently of the other hydrogen, halogen, cyano, nitro, carboxyl, hydroxyl, $C_1$–$C_4$alkyl, $C_1$–$C_4$alkoxy, $C_1$–$C_4$alkylthio or $C_1$–$C_4$alkoxycarbonyl.

7. A copolymer of a phthalaldehyde according to claim 5, which contains the structural unit of formula III as copolymerisable component.

8. A composition containing a polyphthalaldehyde according to claim 1 and a compound that splits off acid when exposed to actinic radication.

9. A composition containing a copolymer according to claim 5 and a compound that splits off acid when exposed to actinic radiation.

10. A method of producing structured positive images, which comprises the use of a composition as claimed in claim 1.

11. A method of producing structured positive images, which comprises the use of a composition as claimed in claim 8.

* * * * *